US010280530B2

(12) United States Patent
Hoshikawa et al.

(10) Patent No.: US 10,280,530 B2
(45) Date of Patent: May 7, 2019

(54) APPARATUS FOR PRODUCING A SINGLE CRYSTAL OF A METAL OXIDE COMPRISING A PT-RH ALLOY HEATER COATED WITH ZIRCONIA

(71) Applicants: FUJIKOSHI MACHINERY CORP., Nagano (JP); SHINSHU UNIVERSITY, Nagano (JP)

(72) Inventors: Keigo Hoshikawa, Nagano (JP); Yasuyuki Fujiwara, Nagano (JP); Keiichi Kohama, Aichi-ken (JP); Shinji Nakanishi, Aichi-ken (JP); Takumi Kobayashi, Nagano (JP); Etsuko Ohba, Nagano (JP)

(73) Assignees: FUJIKOSHI MACHINERY CORP., Nagano (JP); SHINSHU UNIVERSITY, Nagano (JP)

( * ) Notice: Subject to any disclaimer, the term of this patent is extended or adjusted under 35 U.S.C. 154(b) by 0 days.

(21) Appl. No.: 15/866,952

(22) Filed: Jan. 10, 2018

(65) Prior Publication Data
US 2018/0251908 A1    Sep. 6, 2018

(30) Foreign Application Priority Data

Mar. 2, 2017   (JP) .................................. 2017-039286

(51) Int. Cl.
*C30B 11/00*    (2006.01)
*C22C 5/04*    (2006.01)
(Continued)

(52) U.S. Cl.
CPC .............. *C30B 11/002* (2013.01); *C22C 5/04* (2013.01); *C30B 11/003* (2013.01); *C30B 29/16* (2013.01); *C30B 29/30* (2013.01)

(58) Field of Classification Search
CPC .. C30B 9/00; C30B 9/04; C30B 11/00; C30B 11/002; C30B 11/003; C30B 11/006;
(Continued)

(56) References Cited

U.S. PATENT DOCUMENTS

| 2,311,028 | A | * | 2/1943 | Chambers | ................ C22C 5/04 420/466 |
| 3,470,017 | A | * | 9/1969 | Uitert | ...................... B01J 19/02 117/208 |
| 4,144,117 | A | * | 3/1979 | Fukuda | ................... C30B 15/00 117/27 |
| 4,632,817 | A | * | 12/1986 | Yazu | ....................... B01J 3/062 117/41 |

(Continued)

FOREIGN PATENT DOCUMENTS

| JP | S60-210512 | 10/1985 |
| JP | H02-239181 | 9/1990 |

(Continued)

*Primary Examiner* — Kenneth A Bratland, Jr.
(74) *Attorney, Agent, or Firm* — Stites & Harbison PLLC; Stephen J. Weyer

(57) ABSTRACT

To provide a single crystal production apparatus that is capable of prolonging the lifetime of a heater, and capable of reducing the cost. A single crystal production apparatus of the present invention is the single crystal production apparatus which produces a single crystal of a metal oxide in an oxidative atmosphere, containing: a base body; a cylindrical furnace body having heat resistance disposed above the base body; a lid member occluding the furnace body; a heater disposed inside the furnace body; a high frequency coil heating the heater through high frequency induction heating; and a crucible heated with the heater, the heater containing a Pt-based alloy and having a zirconia coating on an overall surface of the heater.

12 Claims, 11 Drawing Sheets

(51) Int. Cl.
*C30B 29/30* (2006.01)
*C30B 29/16* (2006.01)

(58) Field of Classification Search
CPC ......... C30B 29/00; C30B 29/10; C30B 29/16;
C30B 29/22; C30B 29/24; C30B 35/00;
C30B 35/002; Y10T 117/00; Y10T
117/10; Y10T 117/1016; Y10T 117/1024;
Y10T 117/1092; C22C 5/04; F27B 14/00;
F27B 14/06; F27B 14/061; F27B 14/08;
F27B 14/0825; F27B 14/0831; F27B
14/10; F27B 14/12
USPC ......... 117/11, 73, 77, 81–83, 200, 204, 206,
117/223, 900, 937, 944, 947
See application file for complete search history.

(56) References Cited

U.S. PATENT DOCUMENTS

| | | | | |
|---|---|---|---|---|
| 6,136,091 | A | * 10/2000 | Yamazaki | ............ C30B 11/002 117/81 |
| 2009/0013925 | A1 | * 1/2009 | Servant | ................ C30B 11/003 117/206 |
| 2010/0294198 | A1 | * 11/2010 | Wan | ..................... C30B 11/002 117/223 |

FOREIGN PATENT DOCUMENTS

| | | |
|---|---|---|
| JP | 2012-132071 | 7/2012 |
| JP | 2016-079080 | 5/2016 |
| JP | 2016-200254 | 12/2016 |

\* cited by examiner

Crystal A    Crystal B    Crystal C

APPARATUS FOR PRODUCING A SINGLE CRYSTAL OF A METAL OXIDE COMPRISING A PT-RH ALLOY HEATER COATED WITH ZIRCONIA

CROSS-REFERENCE TO RELATED APPLICATION

This application is based upon and claims the benefit of priority of the prior Japanese Patent Application No. 2017-039286, filed on Mar. 2, 2017, and the entire contents of which are incorporated herein by reference.

TECHNICAL FIELD

The present invention relates to a production apparatus for an oxide single crystal, such as a gallium oxide single crystal.

BACKGROUND ART

PTL 1: JP-A-2016-79080 describes a production apparatus for a single crystal of gallium oxide used as a wide-gap semiconductor for a power device, and the like.

Specifically, PTL 1 describes a production apparatus for producing a single crystal of gallium oxide (particularly a $\beta$-$Ga_2O_3$ single crystal) in an oxidative atmosphere, containing a cylindrical furnace body having heat resistance, a lid member for occluding the furnace body, a heater disposed inside the furnace body, a high frequency coil heating the heater through high frequency induction heating, and a crucible heated with the heater, in which the crucible is formed of a Pt—Rh (platinum-rhodium) alloy having a Rh content of from 10 to 30 wt %, and the heater is formed of a Pt—Rh alloy having a Rh content of 30 wt %.

The production apparatus for a gallium oxide single crystal described in PTL 1 has the following advantages due to the use of the crucible and the heater that are formed of a Pt—Rh alloy.

Specifically, while a melting point of Pt as a single material is approximately 1,768° C., a Pt—Rh alloy having a Rh content of from 10 to 30 wt % has a melting point of approximately from 1,850 to 1,930° C., which is significantly higher than the melting point of gallium oxide, 1,795° C., and therefore a single crystal of gallium oxide having a high melting point can be favorably produced by using a crucible and a heater formed of the Pt—Rh alloy.

Furthermore, due to the high melting point of from 1,850 to 1,930° C. of the Pt—Rh alloy having a Rh content of from 10 to 30 wt %, a wide variety of production methods including the VB method, the CZ method, the EFG method, and the like can be applied to the production of an oxide single crystal.

In particular, the Pt—Rh alloy is an alloy of Pt, which is difficult to oxidize, and therefore the crystal growth can be performed in an oxidative atmosphere, providing such an advantage that a crystal having good quality without oxygen deficiency defects can be grown.

SUMMARY OF INVENTION

Technical Problem

However, as a result of earnest investigations by the present inventors, it has been found that a material formed of the aforementioned Pt—Rh alloy having a Rh content of from 10 to 30 wt % still has the following problems in the use in an oxidative atmosphere at a high temperature.

Specifically, Pt has a large oxidation resistance, whereas Rh is easily oxidized, as described above, and therefore in the case where the Pt—Rh alloy is used for a prolonged period of time, Rh tends to be scattered due to gradual detachment from Pt and the oxidative decomposition thereof. The scattering of Rh alters the compositional ratio of the alloy, which disables the use thereof due to the decrease of the melting point. The problem may not be conspicuous for the crucible since the crucible is disposable, but the heater has such a problem that the exchange frequency thereof is increased due to the short lifetime, increasing the cost.

Solution to Problem

The present invention has been made to solve the problem, and an object thereof is to provide a single crystal production apparatus that has a heater having an increased lifetime and is capable of decreasing the cost.

The single crystal production apparatus relating to the present invention is a single crystal production apparatus for producing a single crystal of a metal oxide in an oxidative atmosphere, containing: a base body; a cylindrical furnace body having heat resistance disposed above the base body; a lid member occluding the furnace body; a heater disposed inside the furnace body; a high frequency coil heating the heater through high frequency induction heating; and a crucible heated with the heater, the heater containing a Pt-based alloy and having a zirconia coating on an overall surface of the heater.

The heater preferably contains a Pt—Rh alloy, and particularly a Pt—Rh alloy having a Rh content of from 10 to 30 wt %.

The heater may have a cylindrical shape and may have a notch at a lower part of the heater.

In alternative, the heater may have a cylindrical shape and may have a lower part that has a smaller thickness than the other parts.

The furnace body may have an inner wall that is formed as a heat resistant wall containing plural ring shaped heat resistant members each having a prescribed height that are accumulated on each other, and the ring shaped heat resistant members each may contain plural divided pieces that are joined to each other in a ring shape.

The metal oxide used may be a material having a melting point that is higher than Pt.

In the case where a single crystal of $\beta$-$Ga_2O_3$ is produced, the crucible preferably contains a Pt—Rh alloy, and particularly a Pt—Rh alloy having a Rh content of from 10 to 30 wt %.

In the case where a single crystal of lithium tantalate ($LiTaO_3$, LT) is produced, the crucible may contain Pt or a Pt alloy.

Advantageous Effects of Invention

According to the single crystal production apparatus according to the present invention, the use of the high frequency induction heating furnace having a heater that is formed of a platinum-based alloy having a zirconia coating provides such effects that the alloy component with platinum can be prevented from undergoing oxidative decomposition, enabling repeated use of the heater, which is advantageous in cost, and the oxidative decomposition product can be prevented from being dissolved in the crystal, enabling production of a metal oxide single crystal having high quality.

BRIEF DESCRIPTION OF DRAWINGS

FIGS. 9A, 9B, 9C, and 9D are photographs showing the results of the crossed nicols observation, the X-ray topography observation, and the optical microscope observation of the double-sided mirror polished substrate wherein FIG. 9C is an enlarged photograph showing a dislocation pit line that is locally aligned substantially in a <010> direction in the photograph of FIG. 9B and FIG. 9D is an enlarged photograph showing the defects that are linearly aligned in a size of from 10 μm to several tens μm in the <010> direction in the photograph of FIG. 9B.

DESCRIPTION OF EMBODIMENTS

Examples of Structure of Production Apparatus

Figure 1:
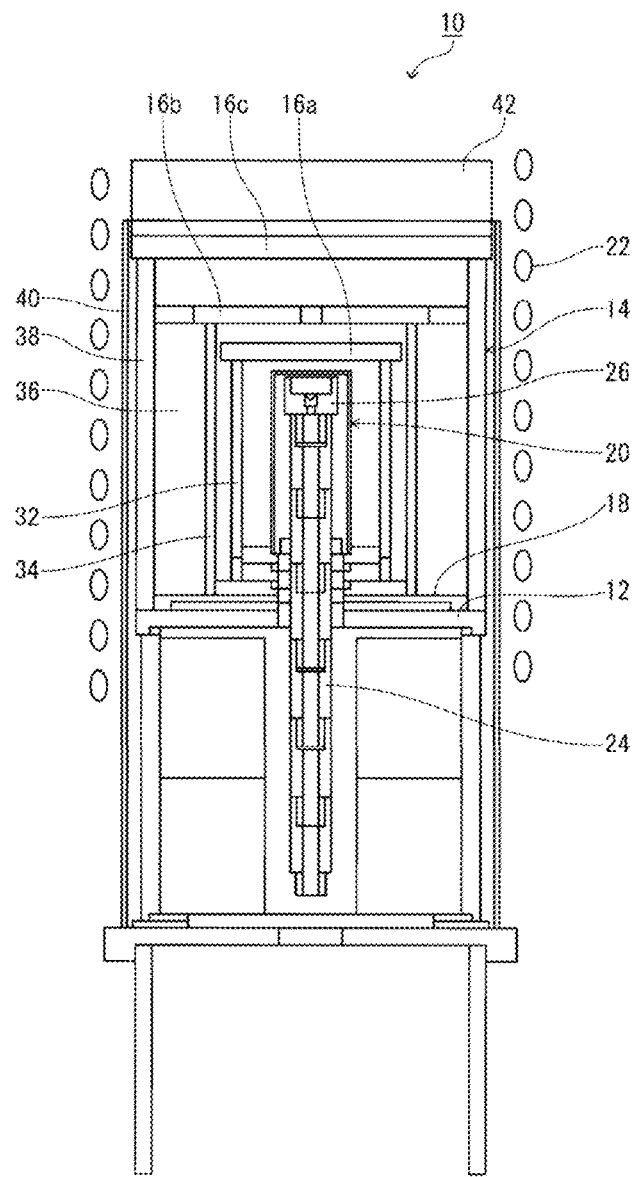
FIG. 1 is a cross sectional view showing the structure of a single crystal production apparatus.

FIG. 1 shows an example of the structure of a single crystal production apparatus 10 according to an embodiment.

The single crystal production apparatus 10 is an apparatus for growing a single crystal of a metal oxide, such as a gallium oxide single crystal and a lithium tantalate single crystal, by the vertical Bridgeman (VB) method or the vertical temperature gradient freezing (VGF) method in an oxidative atmosphere (particularly in the air atmosphere).

In FIG. 1, a furnace body 14 is disposed on a base body 12. The base body 12 has a cooling mechanism (which is not shown in the figure) through which cooling water flows.

The furnace body 14 has a cylindrical shape in total and is formed to have a structure having a heat resistance capable of resisting a high temperature up to approximately 1,900° C.

The opening of the furnace body 14 can be occluded with lid members 16a, 16b, and 16c.

The furnace body 14 has at the lower part thereof a bottom portion 18 containing various heat resistant materials accumulated.

In the furnace body 14, a heater 20 is disposed on the bottom portion 18.

The heater 20 of the embodiment is formed of a Pt-based alloy and has a zirconia coating on the overall surface thereof. The heater 20 is heated through induction heating with a high frequency coil 22 wound on the furnace body 14. That is, the single crystal production apparatus 10 of the embodiment is a high frequency induction heating furnace.

While not shown in the figure, a control part for controlling the electric power (output power) supplied to the high frequency coil 22 is provided. The control part may be a control part that changes the electric energy amount by a manual operation or a control part that automatically controls the electric energy amount with respect to the time according to the requisite input program.

The heater 20 will be described in more detail later.

The bottom portion 18 and the base body 12 each have a through hole penetrating in the vertical direction, and through the through holes, a crucible bearing 24 is provided vertically movably and rotatably with the axis as the center, with a driving mechanism, which is not shown in the figure. The crucible bearing 24 is also formed of a heat resistant material resisting a high temperature, such as alumina.

An adapter 26 formed of a heat resistant material, such as zirconia, is attached to the top end of the crucible bearing 24, and a crucible 28 is disposed inside the adapter 26. The crucible 28 is heated with the heater 20.

Figure 2:
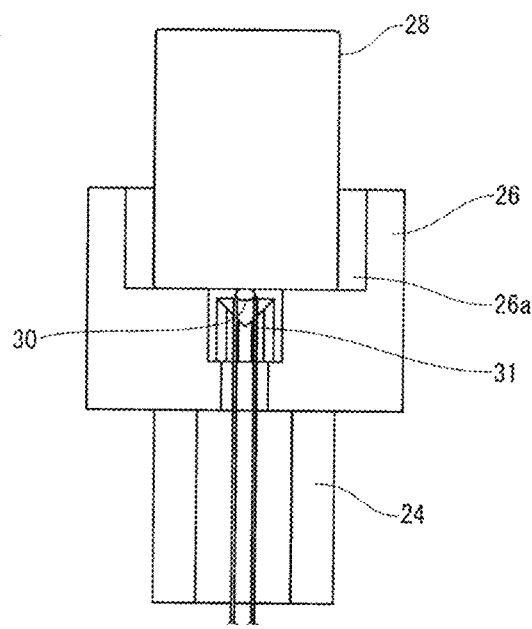
FIG. 2 is an enlarged cross sectional view showing the structure of a portion supporting a crucible.

FIG. 2 shows an enlarged view of the part where the crucible 28 is supported by the adapter 26. The crucible 28 is set in a set portion 26a formed as a depressed portion in the upper part of the adapter 26. A through hole penetrating the adapter 26 and having a larger diameter on the upper side and a smaller diameter on the lower side is opened at the center of the set portion 26a. A head 30 of a thermocouple is set on the step portion in the course of the through hole. The point of the head of the thermocouple is disposed to be in contact with the bottom surface of the crucible 28 in the state where the crucible 28 is set on the adapter 26.

The opposite end of a lead wire 31 of the thermocouple is drawn to a temperature detector through the interior of the crucible bearing 24.

The kind of the crucible 28 will be described in detail later.

The portions of the apparatus will then be described in detail.

In the embodiment shown in the figure, the furnace body 14 has a four-layer structure including a heat resistant wall 32 as the innermost wall, an inner cylinder 34, a thermal insulator layer 36, and an outer cylinder 38, in this order from the inner layer. The numeral 40 denotes a cover member.

Figure 3:
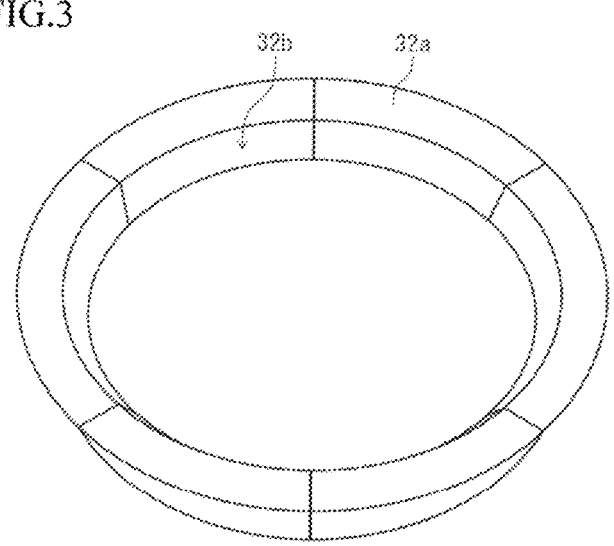
FIG. 3 is a perspective view showing a ring-shaped heat resistant member.
Figure 4:
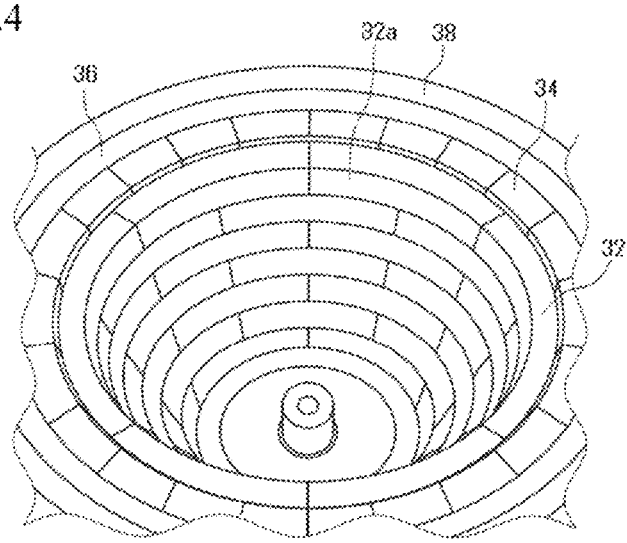
FIG. 4 is a perspective view showing a furnace body.

As shown in FIGS. 3 and 4, the heat resistant wall 32 is formed to have a cylindrical shape by accumulating in the vertical direction plural heat resistant members 32b, each of which contains six divided pieces 32a that are joined to each other in the ring shape having a prescribed height. The heat resistant members 32b formed in the ring shape are preferably disposed by accumulating in such a manner that the divided pieces 32a of the heat resistant members 32b adjacent in the vertical direction to each other are shifted from each other in the circumferential direction as is clear from FIG. 4.

The heat resistant member 32b is not particularly limited, and is preferably formed of alumina, or zirconia having heat resistance to a temperature up to approximately 2,000° C.

The heat resistant wall 32 is formed in a cylindrical shape in total, and the upper end thereof is occluded with the lid member 16a.

The inner cylinder 34 and the outer cylinder 38 each are also formed of a heat resistant member, such as alumina. The inner cylinder 34 is occluded with the lid member 16b. The outer cylinder 38 is also occluded with the lid member 16c. A thermal insulator is filled between the inner cylinder 34 and the outer cylinder 38 to form the thermal insulator layer 36.

The thermal insulator of the thermal insulator layer 36 contains alumina fibers that are aggregated to a prescribed density, and is formed to have a porous nature, to have heat resistance, and to have thermal insulating property.

A thermal insulator layer 42 containing a thermal insulator is disposed on the lid member 16c of the outer cylinder 38.

The heater 20 will be then described.

The heater 20 is formed of a Pt-based alloy and has a zirconia coating on the overall surface thereof including the front and back surfaces.

Figure 5:
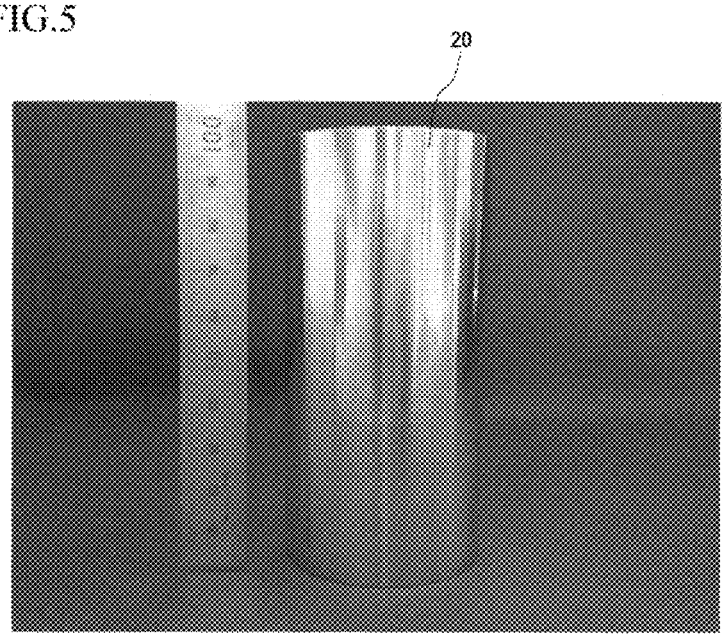
FIG. 5 is a photograph of a heater before coating zirconia.
Figure 6:
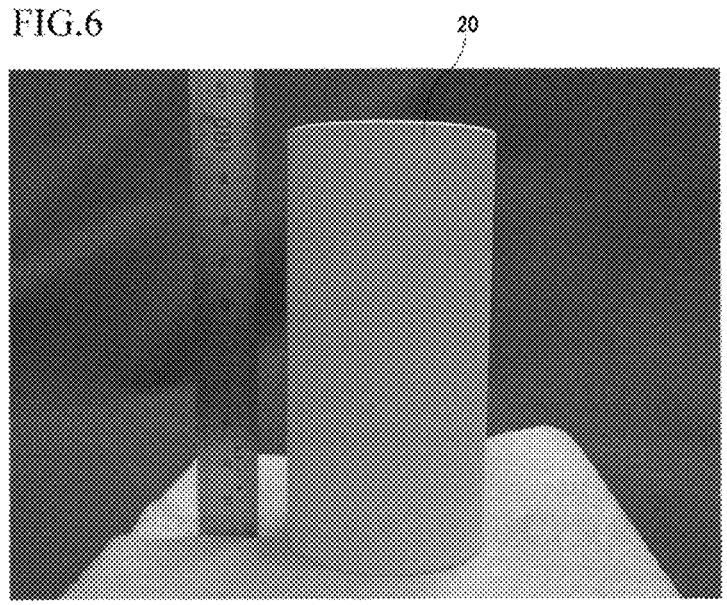
FIG. 6 is a photograph of a heater after coating zirconia.

The heater 20 has a cylindrical shape with a ceiling. FIG. 5 shows a photograph of the heater 20 before coating zirconia, which has a gloss surface. FIG. 6 shows a photograph of the heater 20 after coating zirconia, which has a milky white matte surface.

The zirconia coating on the heater 20 may be formed by a thermal spraying method or the like.

The thickness of the zirconia coating is not particularly limited, and is preferably from several tens to several hundred micrometers. The zirconia coating that has a too large thickness may be cracked and dropped off due to the expansion and contraction caused by the thermal history. The zirconia coating that has a too small thickness may fail to achieve the necessary heat resistance and the necessary effect of preventing Rh scattering.

The heater 20 used may be formed of a Pt-based alloy, such as Pt—Rh, Pt—Mo, Pt—W, Pt—Ir, and Pt—Re alloys, and a heater formed of a Pt—Rh alloy is preferably used. For the alloy composition thereof, a heater formed of a Pt—Rh alloy having a Rh content of from 10 to 30 wt % is more preferably used. By using the heater formed of a Pt—Rh alloy having a Rh content of from 10 to 30 wt %, the melting point thereof is approximately from 1,850 to 1,930° C., which is significantly higher than the melting point of gallium oxide, 1,795° C., and therefore a single crystal of gallium oxide having a high melting point can be favorably produced by using the heater formed of a Pt—Rh alloy as the heater 20.

As described in the foregoing, as a result of earnest investigations by the present inventors, it has been found that in the case where the heater formed of a Pt—Rh alloy having a Rh content of from 10 to 30 wt % is used as the heater 20 at a high temperature for a prolonged period of time, Rh tends to be scattered due to gradual detachment from Pt and the oxidative decomposition thereof. The scattering of Rh alters the compositional ratio of the alloy, which disables the use thereof at a high temperature due to the decrease of the melting point, as described above.

Figure 7:
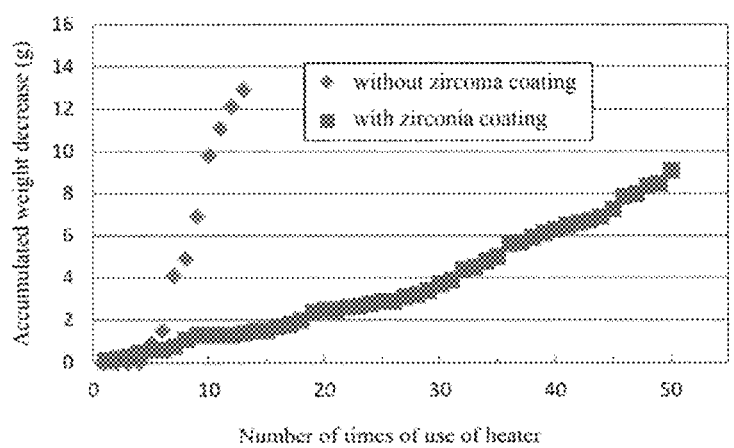
FIG. 7 is a graph showing the accumulated weight decrease of the heater with respect to the number of times of use.

FIG. 7 is a graph showing the weight decrease of the heaters 20 with a zirconia coating and without a zirconia coating, with respect to the number of times of use. The test is performed in such a manner that the heater 20 is taken out from the furnace and measured for the weight thereof in each time of the number of times of use.

As shown in FIG. 7, the heater 20 without a zirconia coating undergoes conspicuous weight decrease in a small number of times of use. On the other hand, the heater 20 with a zirconia coating undergoes suppressed weight decrease, from which it is understood that the lifetime thereof is prolonged. Specifically, the heater is used 50 or more times, and is used in a condition at 1,700° C. or more for 600 hours or more in cumulative total. In a heater formed of a Pt—Rh alloy, Pt is difficult to oxidize, whereas Rh is easily oxidized, and therefore it is considered that the weight decrease of the heater 20 is caused by such a phenomenon that Rh is gradually detached from the alloy, oxidatively decomposed, and scattered due to the use at a high temperature. The zirconia coating formed on the heater 20 may prevent the heater 20 from being in contact with oxygen as much as possible, and thus can prevent Rh from being scattered.

While not shown in the figure, it is preferred that a notch, such as a slit, is provided in a lower part of the heater 20, or the lower part of the heater 20 is formed to have a smaller thickness than the other parts.

According to the structure, the amount of heat generated in the lower part of the heater 20 due to the heat from the high frequency coil 22 can be suppressed lower than the other portions, and thereby Rh can be more effectively suppressed from being scattered.

While the heater 20 is disposed on the bottom portion 18 formed of a thermal insulator, such as sapphire, in the case where the amount of heat generated in the bottom part of the heater 20 is suppressed lower, the heater 20 is prevented from being adhered to the bottom portion 18, which also prevents the drop-off of the zirconia coating caused by the adhesion, and thereby the heater 20 is suppressed from being exposed, suppressing Rh from being scattered.

The growth of the crystal in the crucible 28 is performed in the soaking area in the upper part inside the heater 20, and therefore the growth of the crystal is not impaired even though the amount of heat generated in the lower part of the heater 20 is suppressed lower.

The crucible 28 will be then described.

In the production of a $\beta$-$Ga_2O_3$ crystal, the material of the crucible 28 may be a platinum-based alloy material, and preferably a Pt—Rh alloy material.

By using a platinum-based alloy material, particularly a Pt—Rh alloy material, in the crucible 28, the oxidation of the crucible 28 can be prevented even in the air atmosphere, which is different, for example, from the case using Ir as a single material, and furthermore the crystal growth performed in the air atmosphere, which is rich in oxygen, enables crystal growth of gallium oxide without oxygen deficiency defects.

By using a platinum-based alloy material in the crucible 28, crystal growth of a metal oxide other than gallium oxide having a melting point higher than the melting point of Pt can also be performed.

In the production of a lithium tantalate ($LiTaO_3$, LT) single crystal, a platinum-based material may be used as the material of the crucible. A material having a platinum content of 100% is preferred (the platinum content of 100% encompasses a material containing less than 1% of impurities that are unavoidably mixed in the production thereof), and a material having a purity of 95 wt % or more may be used. A material containing approximately 5 wt % of rhodium (Rh) may also be used. With rhodium in an amount of approximately 5 wt %, elution of rhodium into the crystal can be suppressed lower, and the quality of the crystal may not be adversely affected thereby. The addition of rhodium increases the melting point of the crucible, and thereby the crucible can be effectively prevented from being deformed.

By using a platinum-based material in the crucible 28, the oxidation of the crucible 28 can be prevented even in the air atmosphere, which is different, for example, from the case using Ir as a single material, and furthermore the crystal growth performed in the air atmosphere, which is rich in oxygen, enables crystal growth of a lithium tantalate single crystal having high quality without oxygen deficiency defects.

EXAMPLES

Examples of production of a $\beta$-$Ga_2O_3$ single crystal and a $LiTaO_3$ single crystal by using the single crystal production apparatus 10 shown in FIG. 1 will be shown below.

Example of Crystal Growth of $\beta$-$Ga_2O_3$

In the VB (vertical Bridgeman) furnace shown in FIG. 1, unidirectional freezing $\beta$-$Ga_2O_3$ crystal growth without seed crystal was tried to perform.

A $\beta$-$Ga_2O_3$ sintered material as a raw material was charged in a crucible formed of a Pt—Rh alloy having an inner diameter of 25 mm and a height of 50 mm, and was totally melted in the high temperature furnace (i.e., the apparatus shown in FIG. 1) in the air at 1,800° C. or more having a temperature distribution making a temperature gradient of from 5 to 10° C./cm around the melting point of $\beta$-$Ga_2O_3$ (approximately 1,795° C.). Thereafter, unidirectional freezing was performed by the combination of the movement of the crucible and the decrease of the temperature in the furnace. After cooling, the grown crystal was taken out by detaching the crucible.

Figure 8:
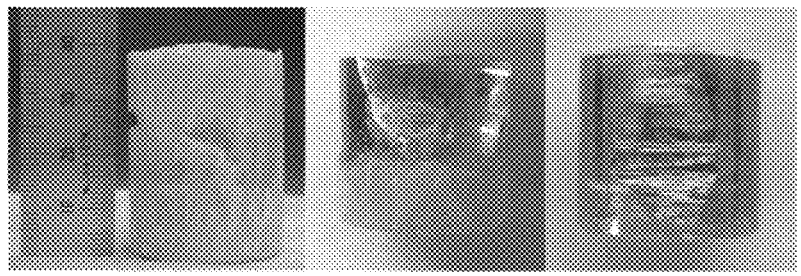
FIG. 8 is a photograph showing three kinds of typical crystals that undergo unidirectional freezing in the crucible.

FIG. 8 is a photograph of crystals showing three kinds of typical crystals obtained by the crystal growth of $\beta$-$Ga_2O_3$ by unidirectional freezing. A crystal A shows the case where the entire material undergoes polycrystalline growth. A crystal B shows the case where polycrystalline growth is quickly transferred to single crystal growth. A crystal C shows the case where single crystal growth occurs from the bottom to the top end. The X-ray diffraction and the observation of characteristic crystal habits identified that both the upper single crystal portion of the crystal B and the single crystal C underwent facet growth of a (100) plane in a <100> direction, and that a (001) facet plane appeared at approximately 104° with respect to the (100) plane, and the direction perpendicular to the two facet planes was a <010> direction. It was confirmed that the (100) plane facet growth in the <100> direction occurred with a high probability without seed due to the strong anisotropy in growing rate, in which the growing rate in the <010> direction was larger by approximately one order of magnitude than in the <100> direction.

From the resulting single crystal, a (100) plane substrate perpendicular to the growth direction was cut out to provide a double-sided mirror polished substrate having a thickness of approximately 0.5 mm. The substrate specimen was subjected to crossed nicols observation, X-ray topography observation, and optical microscope observation after etching with KOH.

Figure 9A:
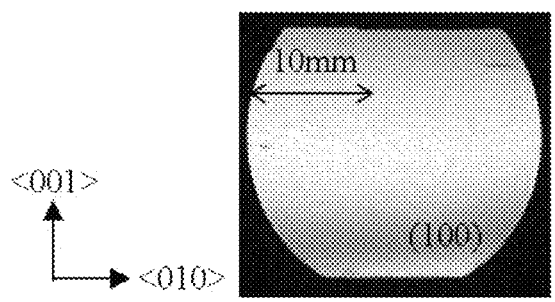
Figure 9B:
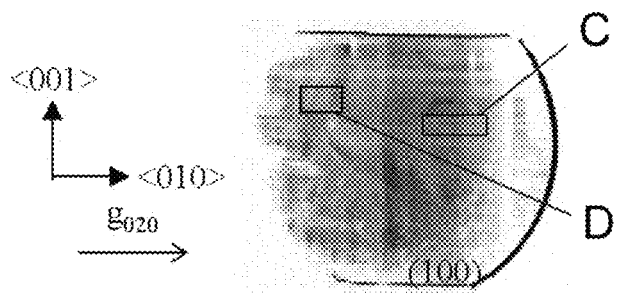
Figure 9C:
Figure 9D:

FIG. 9A shows the result of the crossed nicols observation. The observation revealed that the substrate was a single crystal substrate without a detectable small angle tilt boundary. FIG. 9B shows the transmission X-ray topograph of the same substrate. A transmission X-ray diffraction pattern was obtained except for a part of the outer periphery. The part of the outer periphery lacking the pattern (white portion) corresponds to a high dislocation density region or a slight tilt angle that cannot be detected by the crossed nicols method. FIG. 9C shows a dislocation pit line that is locally aligned substantially in the <010> direction. The pits had a density of approximately $2\times10^3$ per square centimeter. The region corresponding to the white portion in the X-ray topograph shown in FIG. 9B had dislocation pits in a high density of approximately $5\times10^5$ per square centimeter. FIG. 9D shows the defects that are linearly aligned in a size of from 10 µm to several tens µm in the <010> direction that do not correspond to the X-ray topograph. The defects are observed without etching and are considered to be linear defects.

In this example, the crucible 28 was disposable, but the heater 20 formed of a Pt—Rh alloy having a zirconia coating on the overall surface thereof was able to be used repeatedly for 50 or more times of the crystal growth.

Example of Crystal Growth of $LiTaO_3$

Crystal growth of a lithium tantalate single crystal by the VB method may be performed in the following manner.

The high frequency coil 22 is driven with the requisite output power based on data of the output power of the high frequency coil 22 and the temperature inside the furnace body (which may be hereinafter referred to as the temperature in the furnace) having been measured in advance, and thereby the interior of the furnace is heated to have the temperature distribution in the furnace shown in FIG. 10A in advance. FIG. 10B is an enlarged view of a portion a in FIG. 10A. Subsequently, the crucible 28 having a seed crystal of lithium tantalate and a raw material of lithium tantalate housed therein is placed on the adapter 26, and the crucible 28 is ascended to the soaking area by ascending the crucible bearing 24, thereby melting lithium tantalate. Subsequently, the crucible 28 is cooled outside the furnace by descending the crucible bearing 24 to solidify and crystallize the molten lithium tantalate, thereby providing a lithium tantalate single crystal.

Thereafter, the crystal may be subjected to an annealing treatment depending on necessity by decreasing the temperature in the furnace to an appropriate temperature and again ascending the crucible into the furnace.

For taking out the lithium tantalate single crystal from the crucible 28, the crystal may be taken out by cutting the crucible 28 formed of platinum with scissors or the like. The cut crucible 28 may be melted and reused. The crucible 28 is preferably formed of platinum with a thickness of 0.5 mm or less (preferably from 0.1 to 0.2 mm) for facilitating the cutting.

Figure 10A:
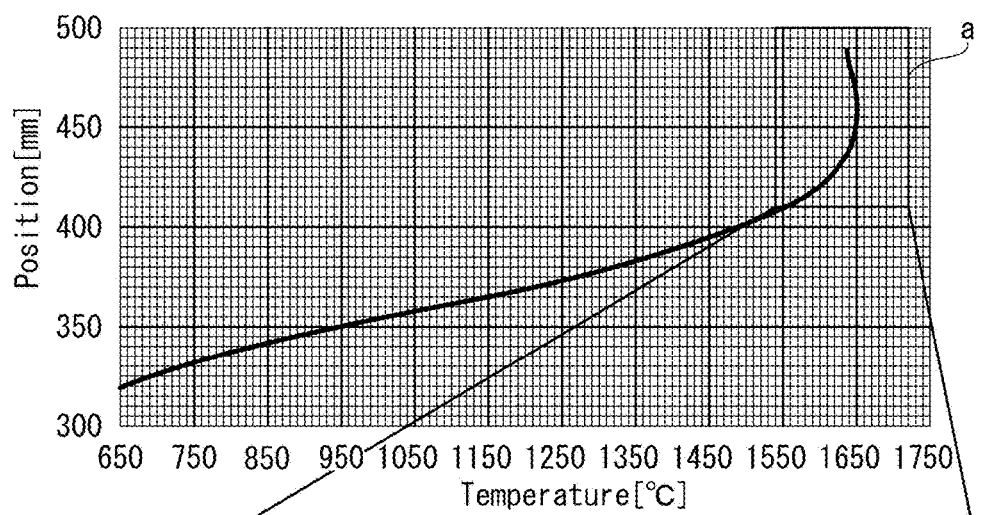
FIG. 10A is a graph showing the temperature distribution in the furnace.
Figure 10B:
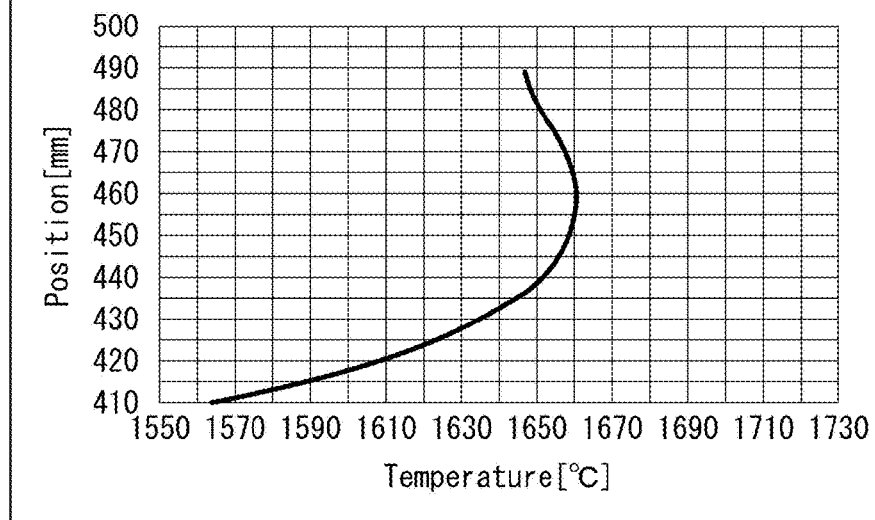
FIG. 10B is an enlarged view of a portion a in FIG. 10A.

Also in crystal growth of a lithium tantalate single crystal by the VGF method, the output power of the high frequency coil 22 for heating the heater 20 to make the temperature distribution in the furnace shown in FIG. 10A is comprehended in advance.

In the crystal growth of a lithium tantalate single crystal by the VGF method, the crucible 28 having a seed crystal of lithium tantalate and a raw material of lithium tantalate housed therein is placed on the adapter 26, and the crucible 28 is ascended to a height position to be the soaking area in the furnace by ascending the crucible bearing 24. Subsequently, the high frequency coil 22 is driven with the requisite output power to increase the temperature in the furnace to have the temperature distribution in the furnace shown in FIG. 10A, thereby melting lithium tantalate. Subsequently, the temperature in the furnace is decreased to solidify and crystallize the molten lithium tantalate, thereby providing a lithium tantalate single crystal. In the VGF method, the temperature in the furnace is increased and decreased while the crucible 28 is fixed at the requisite height position, and therefore there is such an advantage that an annealing treatment can be simultaneously performed on decreasing the temperature. Furthermore, the temperature in the furnace is increased and decreased in the crystal growth, and thus the control of the temperature can be performed finely and precisely, so as to provide a lithium tantalate single crystal having higher quality.

Figure 11:
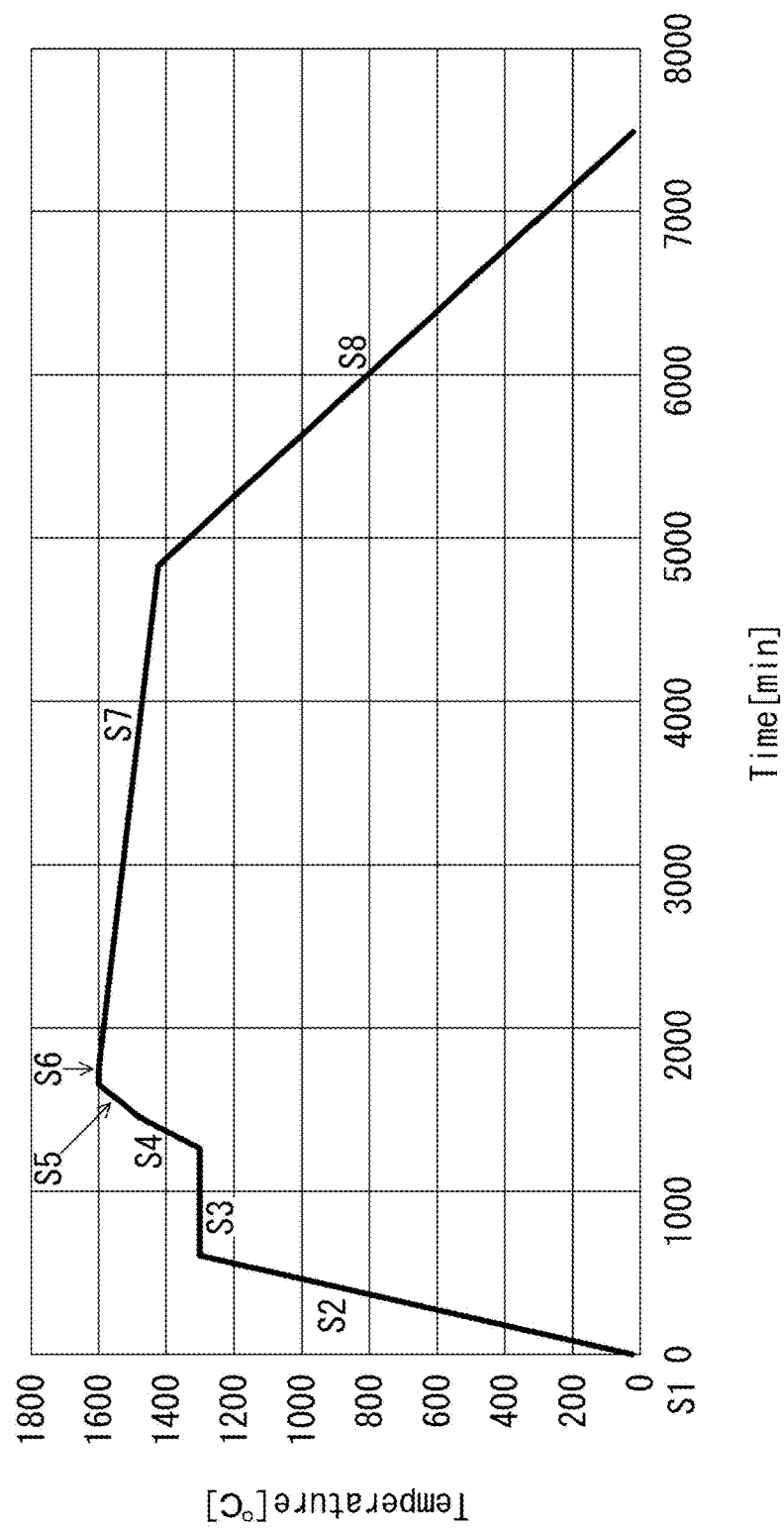
FIG. 11 is a graph showing an example of the temperature profile in the furnace when the temperature in the furnace is controlled according to the VGF method.
Figure 12:
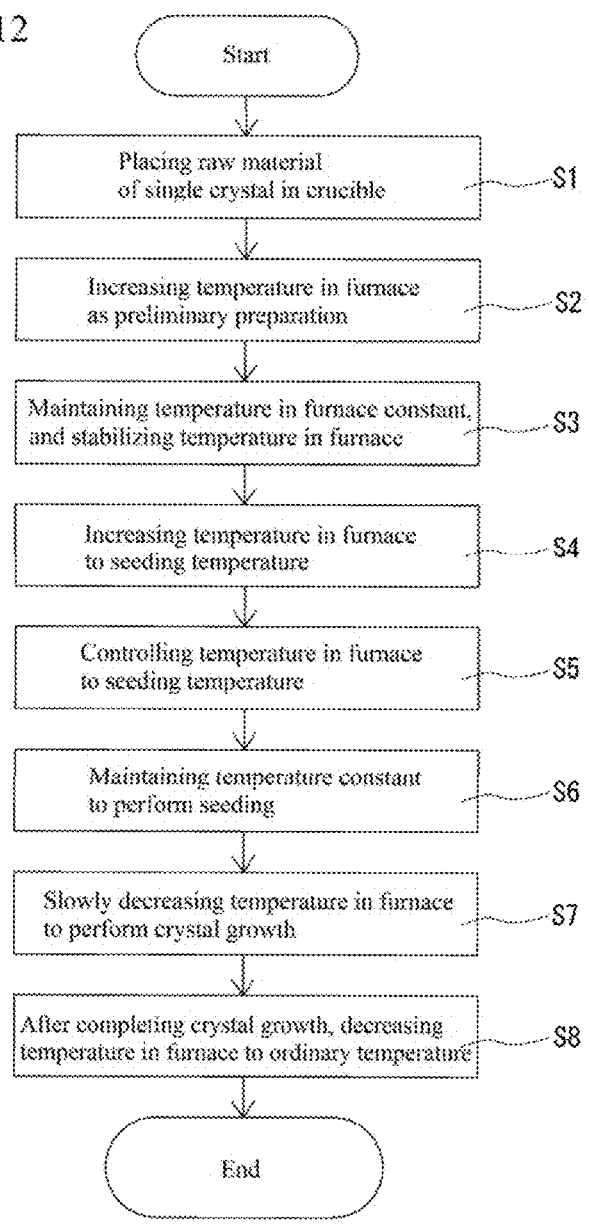
FIG. 12 is a temperature control flow diagram when the control of the temperature in the furnace shown in FIG. 11 is performed.
Figure 13:
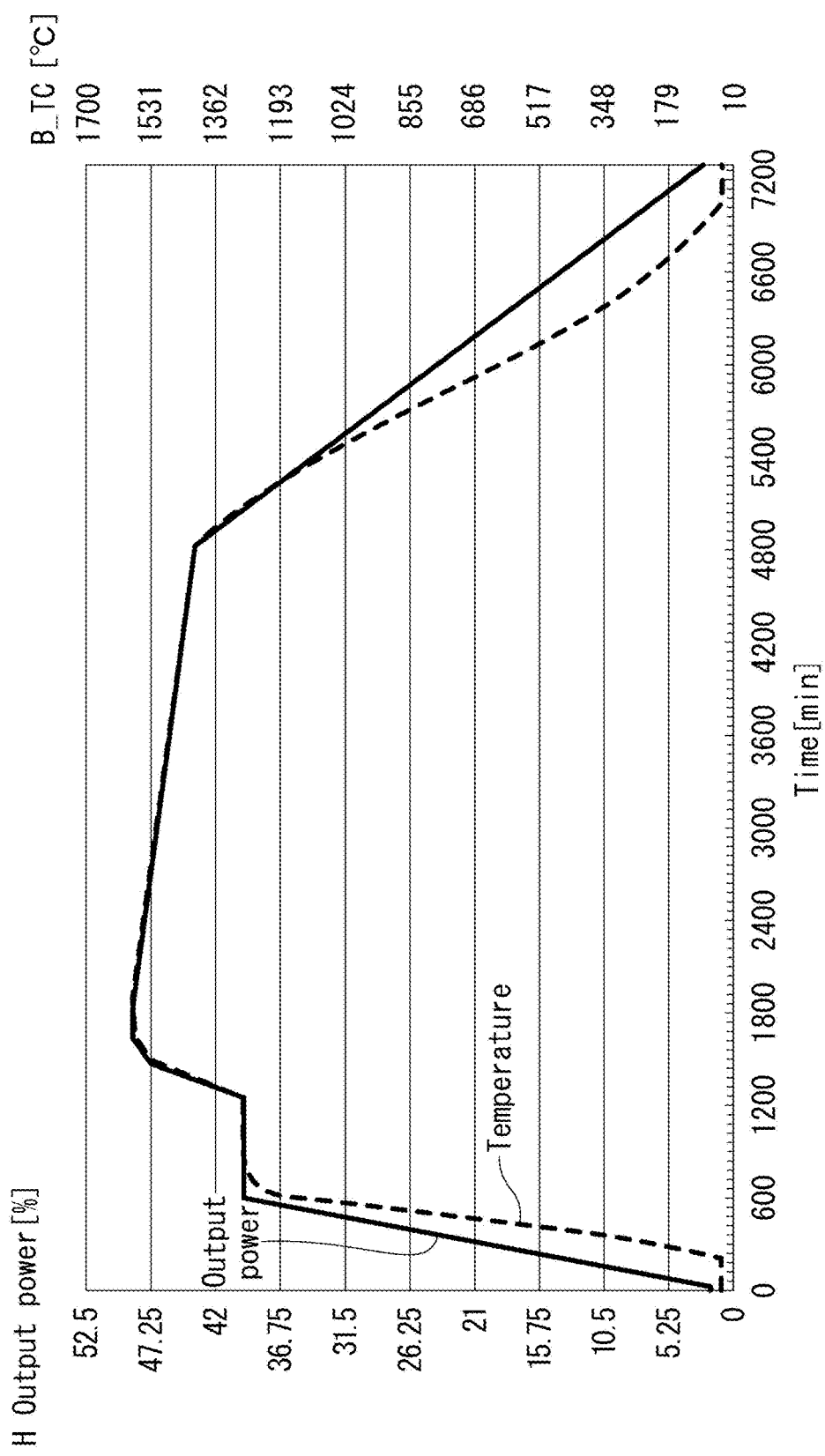
FIG. 13 is a graph showing the followability of the temperature in the furnace with respect to the output power of a high frequency coil when the control of the temperature in the furnace shown in FIG. 11 is performed.

FIG. 11 shows an example of the temperature profile in the furnace when the temperature in the furnace is controlled according to the VGF method. FIG. 12 shows a temperature control flow diagram in the example. FIG. 13 is a graph showing the followability of the temperature in the furnace with respect to the output power of the high frequency coil 22.

In the step S1, a seed crystal of lithium tantalate and a raw material of lithium tantalate are housed in the crucible 28, and the crucible 28 is ascended to the prescribed position (i.e., the position to be the soaking area) in the furnace. The temperature in the furnace is room temperature.

In the step S2, the output power of the high frequency coil 22 is increased relatively quickly to increase quickly the temperature in the furnace to approximately 1,295° C. The period of time therefor is approximately 600 minutes, and the tact time can be shortened thereby. The followability of the temperature in the furnace is low since the output power is quickly increased (FIG. 13).

In the step S3, the output power of the high frequency coil 22 is maintained constant to maintain the temperature in the furnace constant, and the temperature in the furnace is stabilized. The period of time therefor is approximately 650 minutes. However, in the subsequent practice, the stabilization of the temperature in the furnace may not require 650 minutes, but approximately 360 minutes may suffice therefor.

In the step S4, subsequently, the output power of the high frequency coil 22 is again increased quickly, so as to increase the temperature in the furnace to approximately 1,500° C., which is slightly lower than the seeding temperature. The period of time therefor is approximately 230 minutes. The followability of the increase of the temperature in the furnace with respect to the output power of the high frequency coil 22 is high since the temperature in the furnace has been stabilized to uniformize the temperature distribution in the furnace in the step S3 (FIG. 13).

In the step S5, subsequently, the increase of the output power of the high frequency coil 22 is suppressed, so as to increase slowly the temperature in the furnace, i.e., the temperature of the crucible 28, until the seeding temperature. The period of time therefor is approximately 150 minutes. By slowly increasing the temperature in the furnace, the temperature of the crucible 28 can be prevented from overshooting the seeding temperature (approximately 1,586° C.).

In the step S6, the output power of the high frequency coil 22 is maintained constant to maintain the temperature of the crucible 28 constant at approximately 1,586° C., so as to melt the raw material of lithium tantalate and to perform seeding. The period of time therefor is approximately 180 minutes. For the temperature of the crucible 28, the temperature of the bottom of the crucible 28 is measured with the head 30 of the thermocouple, and therefore it is considered that the temperature inside the crucible 28 is increased to a higher temperature of approximately 1,650° C.

As described above, in the step S5, the temperature in the furnace is slowly increased to prevent the temperature of the crucible 28 from overshooting the seeding temperature (approximately 1,586° C., while the practical seeding temperature in the crucible is 1,650° C.), and therefore the formation of a single crystal of lithium tantalate can be performed precisely and efficiently. Furthermore, the crucible 28 may not be overheated, and thus such problems as the deformation of the crucible 28 formed of platinum due to softening can be avoided. Moreover, the followability of the increase of the temperature in the furnace with respect to the output power of the high frequency coil 22 is obviously high in the steps S5 and S6 (FIG. 13).

Accordingly, the platinum crucible can be used without softening and deformation by producing the production apparatus capable of performing the control of the temperature finely and precisely, and by performing the control of the increase of the temperature in the furnace with high followability.

It has also been found that the temperature of the platinum crucible may suffice to be a temperature that is lower by approximately 50° C. than the melting point of platinum (1,768° C.).

Subsequently, in the step S7, the output power of the high frequency coil 22 is slightly decreased to decrease slowly the temperature in the furnace, i.e., the temperature of the crucible 28, to approximately 1,425° C., and thereby the molten lithium tantalate is solidified and crystallized. The period of time therefor is approximately 3,010 minutes. In the step S7, the followability of the decrease of the temperature in the furnace with respect to the output power of the high frequency coil 22 is high (FIG. 13). In the step S7, an annealing treatment is also substantially performed.

In the step S8, the output power of the high frequency coil 22 is decreased relatively quickly to decrease the temperature in the furnace to room temperature, and the crystal growth is thus completed. The period of time for the step S8 is approximately 2,660 minutes. In the step S8, the followability of the decrease of the temperature in the furnace with respect to the output power of the high frequency coil 22 is low (FIG. 13).

As described above, in the embodiment of the control of the temperature in the furnace shown in FIGS. 11 and 12, the temperature in the furnace follows the change of the output power of the high frequency coil 22 with a delay in the steps S1, S2, S3, and S8, but in the steps S4 to S7, particularly the steps S5 to S7, which require fine control of the temperature, the followability of the temperature in the furnace with respect to the output power of the high frequency coil 22 is high. This means that in the steps S5 to S7, which require fine control of the temperature, the requisite precise control of the temperature can be performed, by which a lithium tantalate single crystal having high quality can be grown, and the crystal growth can be performed without the deformation of the crucible 28.

Figure 14:
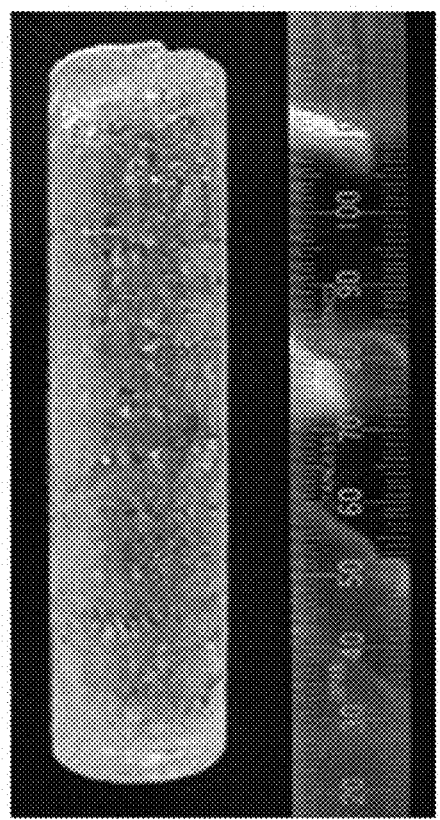
FIG. 14 is a photograph showing a lithium tantalate single crystal obtained by performing crystal growth by the VGF method according to the temperature profile in the furnace shown in FIG. 11, in the high frequency heating furnace shown in FIG. 1 using a crucible of 100% platinum.

FIG. 14 is a photograph showing the lithium tantalate single crystal obtained by performing crystal growth by the VGF method according to the temperature profile in the furnace shown in FIG. 11, in the high frequency heating furnace shown in FIG. 1 using a crucible of 100% platinum.

The temperature profile in the furnace and the control flow shown in FIGS. 11 and 12 are only examples, and the temperature profile and the control flow are not limited thereto.

As described in the foregoing, in the example, by using the VB method or the VGF method capable of decreasing the temperature gradient, the temperature distribution in the furnace can be uniformized, and the maximum temperature in the furnace can be suppressed low, by which a crucible formed of platinum, which has a small difference in melting point from lithium tantalate, can be used without softening and deformation. By using the crucible formed of platinum, accordingly, there is substantially no elusion of the crucible material into the crystal, and in combination with the capability of finely controlling the temperature in the furnace, such an effect is exhibited that a lithium tantalate single crystal having high quality can be grown.

Moreover, the crystal growth of a lithium tantalate single crystal can be performed in an oxidative atmosphere (air atmosphere), and thus there is no necessity of introduction of an inert gas or the like, which is necessary, for example, in the case where a crucible formed of Ir (iridium) is used, resulting in such advantages that the apparatus can be reduced in size, and the annealing treatment can be easily performed.

As described above, the growth of single crystals of gallium oxide and lithium tantalate has been confirmed in the examples, and commercial production of single crystals of metal oxides having a melting point up to approximately 1,800° C. can be achieved by using the single crystal production apparatus of the embodiment.

What is claimed is:

1. An apparatus for producing a single crystal of a metal oxide in an oxidative atmosphere, comprising: a base body; a bottomed cylindrical furnace body having heat resistance and being disposed on the base body; a lid member occluding the furnace body; a heater being provided on a bottom portion of the furnace body and being formed into a cylindrical shape having a ceiling; a high frequency coil heating the heater through high frequency induction heating; and a crucible being provided in the heater and heated by the heater,
    wherein the heater is a Pt—Rh alloy heater and an overall surface of the heater is coated with zirconia.

2. The apparatus for producing a single crystal of a metal oxide in an oxidative atmosphere according to claim 1, wherein the Pt—Rh alloy heater has a Rh content of from 10 to 30 wt %.

3. The apparatus for producing a single crystal of a metal oxide in an oxidative atmosphere according to claim 1, wherein the crucible is a Pt—Rh alloy crucible, and a single crystal of $\beta$-$Ga_2O_3$ is produced.

4. The apparatus for producing a single crystal of a metal oxide in an oxidative atmosphere according to claim 2, wherein the crucible contains a Pt—Rh alloy, and a single crystal of $\beta$-$Ga_2O_3$ is produced.

5. The apparatus for producing a single crystal of a metal oxide in an oxidative atmosphere according to claim 3, wherein the Pt—Rh alloy crucible has a Rh content of from 10 to 30 wt %.

6. The apparatus for producing a single crystal of a metal oxide in an oxidative atmosphere according to claim 4, wherein the Pt—Rh alloy crucible has a Rh content of from 10 to 30 wt %.

7. The apparatus for producing a single crystal of a metal oxide in an oxidative atmosphere according to claim 1, wherein the crucible is a Pt crucible, and a single crystal of $LiTaO_3$ is produced.

8. The apparatus for producing a single crystal of a metal oxide in an oxidative atmosphere according to claim 2, wherein the crucible is a Pt crucible, and a single crystal of $LiTaO_3$ is produced.

9. An apparatus for producing a single crystal of a metal oxide in an oxidative atmosphere, comprising: a base body; a bottomed cylindrical furnace body having heat resistance and being disposed on the base body; a lid member occluding the furnace body; a heater being provided on a bottom portion of the furnace body and being formed into a cylindrical shape having a ceiling; a high frequency coil heating the heater through high frequency induction heating; and a crucible being provided in the heater and heated by the heater,
    wherein the heater is a Pt—Rh alloy heater and an overall surface of the heater is coated with zirconia, and
    a notch is provided in a lower part of the cylindrical heater which is provided on the bottom portion of the furnace body.

10. The apparatus according to claim 9,
    wherein Pt—Rh alloy heater has a Rh content of from 10 to 30 wt %,
    the crucible is a Pt—Rh alloy crucible having a Rh content of from 10 to 30 wt %, and
    the apparatus produces a $\beta$-$Ga_2O_3$ single crystal.

11. An apparatus for producing a single crystal of a metal oxide in an oxidative atmosphere, comprising: a base body; a bottomed cylindrical furnace body having heat resistance and being disposed on the base body; a lid member occluding the furnace body; a heater being provided on a bottom portion of the furnace body and being formed into a cylindrical shape having a ceiling; a high frequency coil heating the heater through high frequency induction heating; and a crucible being provided in the heater and heated by the heater,
    wherein the heater is a Pt—Rh alloy heater and an overall surface of the heater is coated with zirconia, and
    a lower part of the cylindrical heater which is provided on the bottom portion of the furnace body, has a smaller thickness than other parts.

12. The apparatus according to claim 11,
    wherein the Pt—Rh alloy heater has a Rh content of from 10 to 30 wt %,
    the crucible is a Pt—Rh alloy crucible having a Rh content of from 10 to 30 wt %, and
    the apparatus produces a $\beta$-$Ga_2O_3$ single crystal.

* * * * *